US009571068B1

(12) United States Patent
Lin

(10) Patent No.: US 9,571,068 B1
(45) Date of Patent: Feb. 14, 2017

(54) POWER GATING CIRCUIT AND CONTROL METHOD FOR POWER GATING SWITCH THEREOF

(71) Applicant: Winbond Electronics Corp., Taichung (TW)

(72) Inventor: Che-Min Lin, New Taipei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/817,206

(22) Filed: Aug. 3, 2015

(51) Int. Cl.
*H03B 1/00* (2006.01)
*H03K 3/00* (2006.01)
*H03K 3/012* (2006.01)
*H03K 17/30* (2006.01)

(52) U.S. Cl.
CPC ............ *H03K 3/012* (2013.01); *H03K 17/302* (2013.01)

(58) Field of Classification Search
CPC .... H03K 17/04; H03K 17/687; H03K 17/063; H03F 3/2171
USPC ........ 327/108–112, 427, 434, 437, 543, 379, 327/170, 172–175; 326/82, 83, 87; 323/313, 323/222, 224, 282
See application file for complete search history.

(56) References Cited

U.S. PATENT DOCUMENTS 8,884,687 B2 11/2014 Yoon et al.
2012/0187935 A1* 7/2012 Simons .................. G05F 1/575
                                                                323/313
2013/0063186 A1* 3/2013 DeBeer ................ H03K 17/164
                                                                327/109

FOREIGN PATENT DOCUMENTS

TW          200916993          4/2009
TW          201330498          7/2013

* cited by examiner

*Primary Examiner* — Lincoln Donovan
*Assistant Examiner* — Thomas Skibinski
(74) *Attorney, Agent, or Firm* — Jianq Chyun IP Office

(57) ABSTRACT

A power gating circuit and a control method for power gating switch thereof are provided. The power gating circuit includes a first switch, the power gating switch, a pre-charge circuit, and a control circuit. A first terminal and a second terminal of the first switch are coupled to a first voltage and the control terminal of the power gating switch, respectively. A first terminal and a second terminal of the power gating switch are coupled to a second voltage and a function circuit, respectively. An input signal defines a powered period of the function circuit. According to the input signal, the pre-charge circuit pre-charges the control terminal of the power gating switch during the first sub-period of the powered period, and the control circuit controls the first switch to charge the control terminal of the power gating switch by the first voltage during the second sub-period of the powered period.

12 Claims, 7 Drawing Sheets

POWER GATING CIRCUIT AND CONTROL METHOD FOR POWER GATING SWITCH THEREOF

BACKGROUND OF THE DISCLOSURE

Field of the Disclosure

The disclosure relates to a power gating circuit, and relates particularly to a power gating circuit and a control method for a power gating switch thereof.

Description of Related Art

Along with portable products (for example, a cell phone, a digital camera, a notebook computer and the like) becoming increasingly widespread, how to reduce the power consumption of the portable products has currently become a significantly important task.

One of the methods for reducing the power consumption of a circuit is to use a power gating circuit. The power gating circuit may control the power supply situation of the power supply circuit to the function circuit. When a function circuit enters power saving mode, the power gating circuit may make the power supply circuit stop supplying power to the function circuit, and may resolve the sub-threshold current leakage problem of the function circuit blocks, and lowering the overall power consumption.

FIG. 1 is a circuit diagram of a conventional power gating circuit 100. The power gating circuit 100 in FIG. 1 is implemented by connecting a plurality of inverters INV11, INV22, INV33 and power gate switches SWP11, SWP12 in series. An input signal VS defines a powered period of a function circuit 10. Whether to allow a voltage provided by a voltage source VDD1 to pass through the power gating switch SWP11 to supply power to the function circuit 10 may be determined by controlling an input signal VS. When the function circuit 10 enters power saving mode, the power gating circuit 100 may make the voltage source VDD1 stop supplying power to the function circuit 10. When the power gating switch SWP11 cuts off the transmission path between the voltage source VDD1 and the function circuit 10, and/or when the power gating switch SWP12 cuts off the transmission path between the ground voltage GND and the function circuit 10, the power consumption of the function circuit may be reduced effectively.

However, the power gating switches SWP11, SWP12 require a substantially large path area to transmit large amounts of current to the function circuit 10 when the power gating switches SWP11, SWP12 of the power gating circuit 100 turns on. In order to turn on the power gating switches SWP11, SWP12 which have large path areas, a conventional power gating circuit is required to consume a large current of a high voltage source VPP, referred to as a wake up current. A voltage of the voltage source VPP typically is greater than the voltage of the voltage source VDD1. In order to supply the large amounts of current, a large voltage pump and a capacitor needs to be disposed on the voltage source VPP. Therefore, how to develop a circuit to reduce the large current of the voltage source VPP that is consumed when switching the power gating circuit effectively is a problem which needs to be solved.

SUMMARY OF THE DISCLOSURE

In view of this, the disclosure provides a power gating circuit and a control method for a power gating switch thereof. The power gating circuit may reduce the current of the first voltage source that is consumed when the power gating switch is switched.

An embodiment of the disclosure provides a power gating circuit. The power gating circuit includes a first switch, a power gating switch, a pre-charging circuit and a control circuit. A first terminal of the first switch is coupled with a first voltage source. A control terminal of the power gating switch is coupled with a second terminal of the first switch, a first terminal of the power gating switch is coupled with a second voltage source, a second terminal of the power gating switch is used to couple to a power terminal of a function circuit. An input terminal of the pre-charging circuit receives an input signal, an output terminal of the pre-charging circuit is coupled with the control terminal of the power gating switch. Wherein, the input signal defines a powered period of the function circuit, the pre-charging circuit is used to perform pre-charging on the control terminal of the power gating switch during a first sub-period of the powered period. An input terminal of the control circuit receives the input signal, an output terminal of the control circuit is coupled with a control terminal of the first switch. The control circuit controls the first switch such that the first voltage source performs charging on the control terminal of the power gating switch during a second sub-period of the powered period.

An embodiment of the disclosure provides a control method for a power gating switch adapted for a power gating circuit, the control method includes the following steps. An input signal is received, wherein the input signal defines a powered period of a function circuit. Pre-charging on a control terminal of the power gating switch is performed through a pre-charging circuit in the power gating circuit during a first sub-period of the powered period. A first switch is controlled through a control circuit in the power gating circuit during a second sub-period of the powered period, such that a first voltage source performs charging on the control terminal of the power gating switch through the first switch.

Based on the above, the embodiments of the disclosure disclose a power gating circuit and a control method for the power gating switch thereof. When the input signal of the power gating circuit is switched, the pre-charging circuit in the power gating circuit will perform pre-charging on the control terminal of the power gating switch. Then, the first switch is controlled through the control circuit in the power gating circuit, such that the first voltage source continues to perform charging on the control terminal of the power gating switch through the first switch. In this way, the current of the first voltage source consumed when the power gating switch is switched may be reduced.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
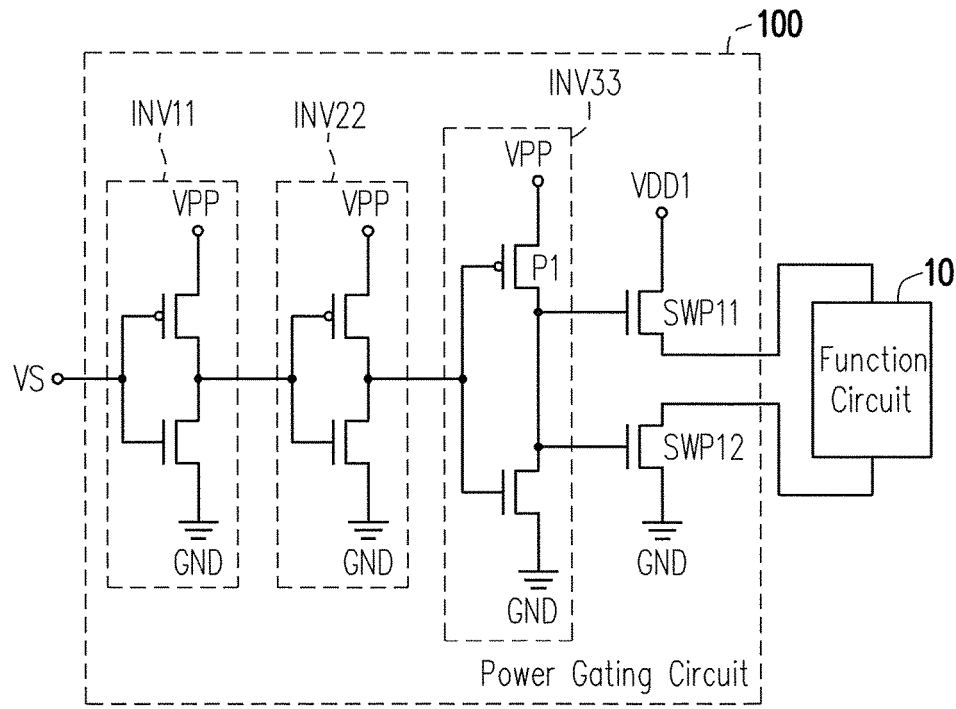
FIG. 1 is a circuit diagram of a conventional power gating circuit.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
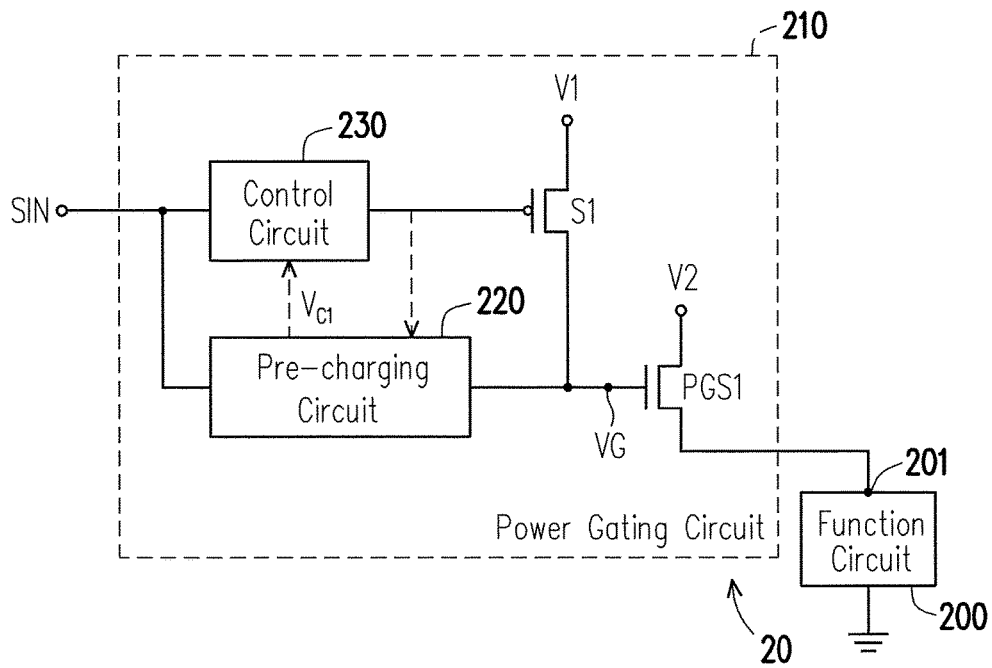
FIG. 2 is a circuit block diagram of a power gating circuit according to an embodiment of the disclosure.

FIG. 2 is a circuit block diagram of a power gating circuit 210 according to an embodiment of the disclosure. Referring to FIG. 2, a system 20 includes a function circuit 200 and a power gating circuit 210. The function circuit 200 has a power terminal 201, used to receive power required to operate the function circuit 200. An input signal SIN defines a powered period of the function circuit 200. Whether to allow a voltage of a second voltage source V2 to pass through the power gating circuit 210 to provide the function circuit 200 with the required power may be determined by controlling the input signal SIN.

The power gating circuit 210 includes a first switch S1, a power gating switch PGS1, a pre-charging circuit 220 and a control circuit 230. In the present embodiment, the first switch S1, for example, is a P-channel metal oxide semiconductor (PMOS) transistor, and the power gating switch PGS1, for example, is an N-channel metal oxide semiconductor (NMOS) transistor, however the disclosure is not limited thereto. A first terminal of the first switch S1 (for example, a source) is coupled to a first voltage source V1. A first terminal (for example, a drain) of the power gating switch PGS1 is coupled to the second voltage source V2. Wherein, a voltage of the first voltage source V1 is larger than a voltage of the second voltage source V2. A second terminal of the power gating switch PGS1 (for example, a source) may be coupled to the power terminal 201 of the function circuit 200. A control terminal (for example, a gate) of the power gating switch PGS1 is coupled to a second terminal (for example, a drain) of the first switch S1. The power gating switch PGS1 may determine whether to allow the power supply voltage provided by the second voltage source V2 to pass through the power gating switch PGS1 to provide power to the function circuit 200 according to a control terminal voltage VG of the power gating switch PGS1.

An input terminal of the pre-charging circuit 220 receives the input signal SIN, and an output terminal of the pre-charging circuit 220 is coupled to the control terminal of the power gating switch PGS1. In the present embodiment, the powered period defined by the input signal SIN may be divided into at least two stages, for example a first sub-period and a second sub-period (however the disclosure is not limited thereto). The pre-charging circuit 220 may perform pre-charging on the control terminal of the power gating switch PGS1 during the first sub-period of the powered period.

The input terminal of the control circuit 230 receives the input signal SIN. The output terminal of the control circuit 230 is coupled to the control terminal (for example, a gate) of the first switch S1. During the second sub-period of the powered period, the control circuit 230 controls the first switch S1, such that the first voltage source V1 performs charging on the control terminal of the power gating switch PGS1 during the second sub-period.

For example, in some embodiments, when the input signal SIN switches from a logic level high voltage to a logic level low voltage, the pre-charging circuit 220 is first performing pre-charging on the gate terminal of the power gating switch PGS1 during the first sub-period. Then (namely, the second sub-period), the first switch S1 is controlled by the control circuit 230, such that the first voltage source V1 continues to charge the gate terminal of the power gating switch PGS1.

Figure 3:
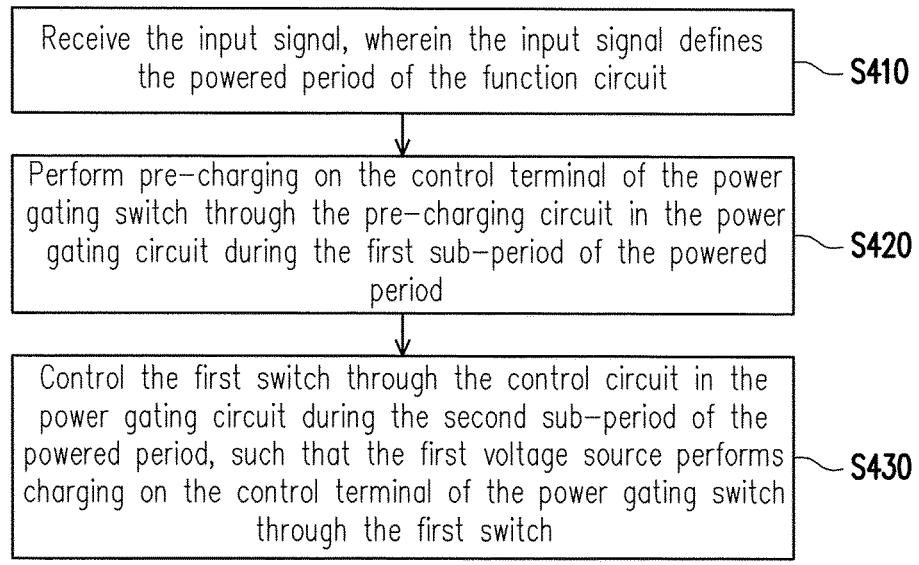
FIG. 3 is a schematic flow diagram of a control method for a power gating switch according to an embodiment of the disclosure.
Figure 4:
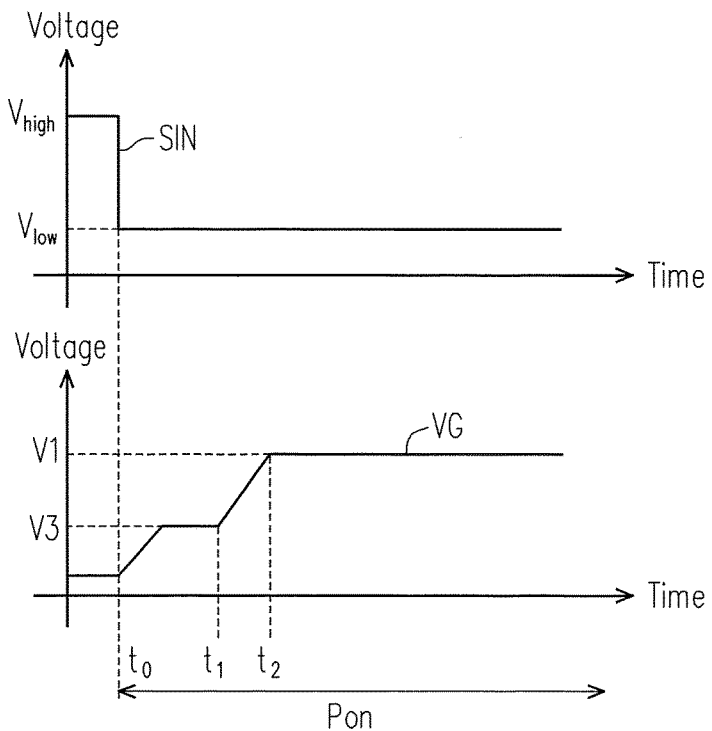
FIG. 4 illustrates a signal timing diagram of FIG. 2 according to an embodiment of the disclosure.

FIG. 3 is a schematic flow diagram of a control method for a power gating switch according to an embodiment of the disclosure. FIG. 4 illustrates a signal timing diagram of FIG. 2 according to an embodiment of the disclosure. Referring to FIG. 2, FIG. 3 and FIG. 4, in a step S410, the pre-charging circuit 220 and the control circuit 230 receives the input signal SIN, wherein the input signal SIN defines the powered period of the function circuit 200. For example, as shown in FIG. 4, when the input signal SIN switches from a logic level high voltage $V_{high}$ to a logic level low voltage $V_{low}$, the powered period Pon of the function circuit 200 starts. In the present embodiment, the powered period Pon of the power gating circuit 210 includes two stages, for example, the first sub-period (the period of time to $t_0$ time $t_1$) and the second sub-period (the period of time $t_1$ to time $t_2$), as shown in FIG. 4. The power gating circuit 210 may transmit the power supply voltage outputted by the second voltage source V2 to the function circuit 200 after the second sub-period ends.

In a step S420, the pre-charging circuit 220 in the power gating circuit 210 performs pre-charging on the control terminal of the power gating switch PGS1 during the first sub-period (the period of time to $t_0$ time $t_1$) of the powered period Pon. During the first sub-period, the control terminal voltage VG of the power gating switch PGS1 will be pre-pulled up to a pre-charging voltage outputted by a third voltage source V3 (described later).

In a step S430, the control circuit 230 in the power gating circuit 210 controls the first switch S1 during the second sub-period (the period of time $t_1$ to time $t_2$) of the powered period Pon, such that the first voltage source V1 performs charging on the control terminal of the power gating switch PGS1 through the first switch S1. During the second sub-period, the control terminal voltage VG of the power gating switch PGS1 will be pulled-up to a driving voltage of the first voltage source V1.

In summary, in the present embodiment, the power gating circuit 210 may perform power gating operations on the function circuit 200 according to the input signal SIN. In the process of the power gating operation, the power gating circuit 210 may use the pre-charging circuit 220 to perform pre-charging on the control terminal of the power gating switch PGS1, and then use the first voltage source V1 to continue to perform charging on the control terminal of the power gating switch PGS1 through the first switch S1. Therefore, the power gating circuit 210 may lower the current of the first voltage source V1 that is consumed when the power gating switch PGS1 is switched.

In some embodiments (but not limited thereto), the output terminal of the control circuit 230 also may be coupled to the control terminal of the pre-charging circuit 220, and used to stop the pre-charging performed on the gate terminal of the power gating switch PGS1 by the pre-charging circuit 220 during the second sub-period. In other embodiments (but not limited thereto), the pre-charging circuit 220 also may output a control signal Vc1 to the control terminal of the control circuit 230, such that the first switch S1 remains off before the pre-charging circuit 220 performs pre-charging on the gate terminal of the power gating switch PGS1.

Figure 5:
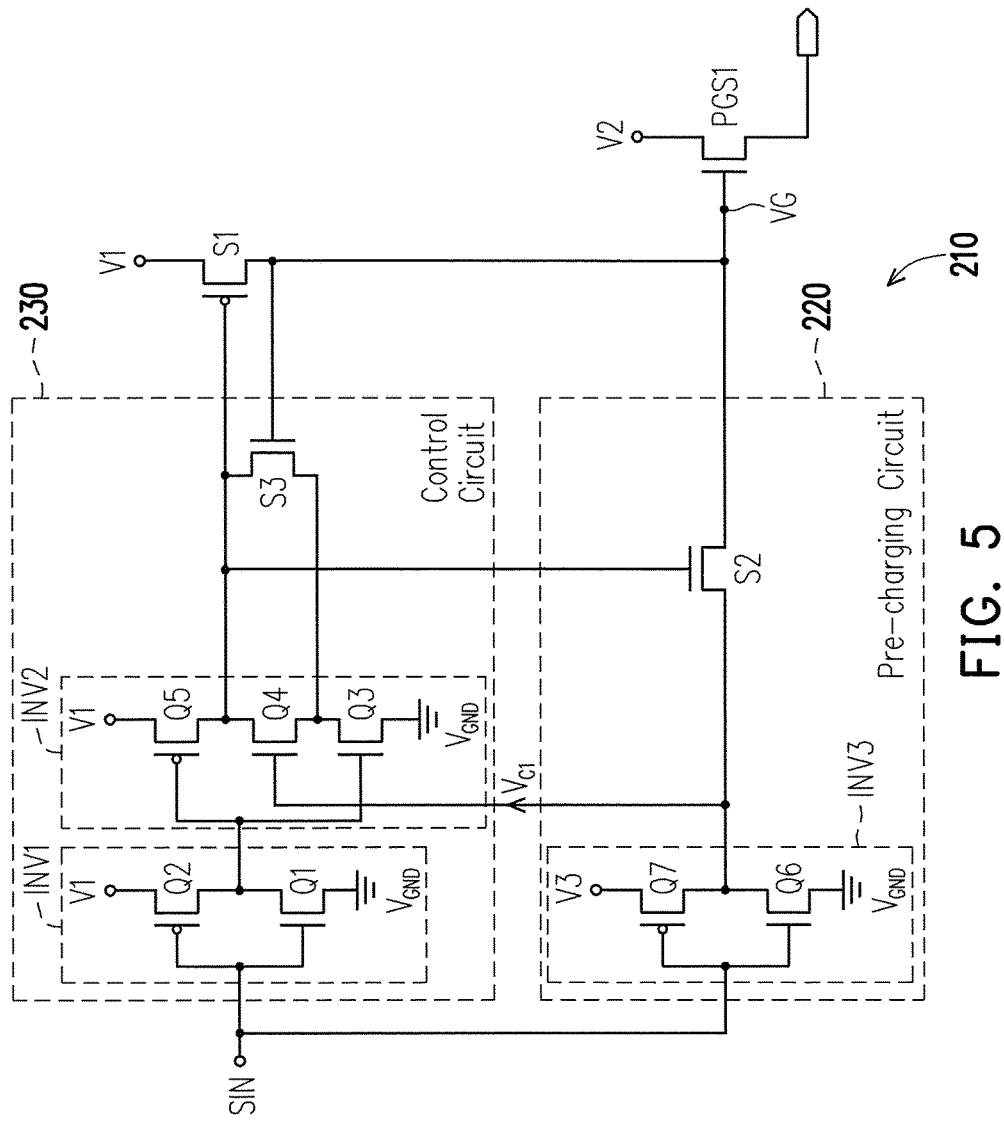
FIG. 5 is a schematic circuit diagram of the power gating circuit of FIG. 2 according to an embodiment of the disclosure.

FIG. 5 is a schematic circuit diagram of the power gating circuit 210 of FIG. 2 according to an embodiment of the disclosure. Here, the internal circuit structure of the pre-charging circuit 220 and the control circuit 230 will be described. Referring to FIG. 5, the control circuit 230 includes a first inverter INV1 and a second inverter INV2. An input terminal of the first inverter INV1 receives the input signal SIN. An input terminal of the second inverter INV2 is coupled with an output terminal of the first inverter INV1. An output terminal of the second inverter INV2 is coupled to the control terminal of the first switch S1. The first inverter INV1 and the second inverter INV2 may be implemented in any manner. In some embodiments (but not limited thereto), the output terminal of the second inverter INV2 also may be coupled to the control terminal of the pre-charging circuit 220, so as to stop the pre-charging that is performed on the control terminal of the power gating switch PGS1 by the pre-charging circuit 220.

In the present embodiment, the first inverter INV1 includes a first transistor Q1 and a second transistor Q2, wherein the first transistor Q1 is an NMOS transistor and the second transistor Q2 is a PMOS transistor; however it should not be construed as a limitation to the disclosure. A control terminal (for example, a gate) of the first transistor Q1 receives the input signal SIN. A first terminal (for example, a source) of the transistor Q1 is coupled with a ground voltage source $V_{GND}$. A second terminal (for example, a drain) of the first transistor Q1 is coupled to the input terminal of the second inverter INV2. A control terminal (for example, a gate) of the second transistor Q2 receives the input signal SIN. A first terminal (for example, a drain) of the second transistor Q2 is coupled to the second terminal of the first transistor Q1. A second terminal (for example, a source) of the second transistor Q2 is coupled to the first voltage source V1.

In the present embodiment, the second inverter INV2 includes a first transistor Q3, a second transistor Q4 and a third transistor Q5, wherein the first transistor Q3 and the second transistor Q4 are NMOS transistors and the third transistor Q5 is a PMOS transistor, however it should not be construed as a limitation to the disclosure. A control terminal (for example, a gate) of the first transistor Q3 is coupled to the output terminal of the first inverter INV1. A first terminal (for example, a source) of the first transistor Q3 is coupled with the ground voltage source $V_{GND}$. A control terminal (for example, a gate) of the second transistor Q4 is coupled with the pre-charging circuit 220. The pre-charging circuit 220 may control the second inverter INV2 through the control signal Vc1, such that the first switch S1 remains off before the pre-charging circuit 220 performs pre-charging on the gate terminal of the power gating switch PGS1. A first terminal (for example, a source) of the second transistor Q4 is coupled with a second terminal (for example, a drain) of the first transistor Q3. A second terminal (for example, a drain) of the second transistor Q4 is coupled with the control terminal of the first switch S1. A control terminal (for example, a gate) of the third transistor Q5 is coupled with the output terminal of the first inverter INV1. A first terminal (for example, a drain) of the third transistor Q5 is coupled with the second terminal of the second transistor Q4. A second terminal (for example, a source) of the third transistor Q5 is coupled with the first voltage source V1.

Continuing to refer to FIG. 5, the pre-charging circuit 220 includes a third inverter INV3 and a second switch S2. In the present embodiment, the second switch S2 is an NMOS transistor, however the disclosure is not limited thereto. An input terminal of the inverter INV3 receives the input signal SIN. A first terminal (for example, a drain) of the second switch S2 is coupled with an output terminal of the third inverter INV3. A control terminal (for example, a gate) of the second switch S2 is coupled with the output terminal of the control circuit 230. A second terminal (for example, a source) of the second switch S2 is coupled with the control terminal of the power gating switch PGS1.

In the present embodiment, the third inverter INV3 includes a first transistor Q6 and a second transistor Q7, wherein the first transistor Q6 is an NMOS transistor and the second transistor Q7 is a PMOS transistor; however it should not be construed as a limitation to the disclosure. A control terminal (for example, a gate) of the first transistor Q6 receives the input signal SIN. A first terminal (for example, a source) of the transistor Q6 is coupled with the ground voltage source $V_{GND}$. A second terminal (for example, a drain) of the first transistor Q6 is coupled with the first terminal of the second switch S2. A control terminal (for example, a gate) of the second transistor Q7 receives the input signal SIN. A first terminal (for example, a drain) of the second transistor Q7 is coupled with the second terminal of the first transistor Q6. A second terminal (for example, a source) of the second transistor Q7 is coupled with the third voltage source V3. It should be noted, the third voltage source V3 is different from the first voltage source V1. For example (but not limited thereto), the voltage of the first voltage source V1 is not only greater than the voltage of the second voltage source V2, but at the same is also greater than a voltage of the third voltage source V3.

Referring to FIG. 3, FIG. 4 and FIG. 5, in a step S410, the pre-charging circuit 220 and the control circuit 230 receives the input signal SIN, wherein the input signal SIN defines the powered period Pon of the function circuit 200. In a step S420, the pre-charging circuit 220 in the power gating circuit 210 may perform pre-charging on the control terminal of the power gating switch PGS1 during the first sub-period (the period of time to $t_0$ time $t_1$) of the powered period Pon.

Before entering the powered period Pon, the input signal SIN is a logic level high voltage $V_{high}$, therefore the output voltage of the inverter INV1 and the inverter INV3 are low level voltages, and the output voltage of the inverter INV2 is a high level voltage. At this time, the second switch S2 is turned on state by the high level voltage signal outputted by the control circuit 230. In addition, the first switch S1 remains off by the high level voltage signal outputted by the control circuit 230. Therefore, the low level voltage output-ted by the inverter INV3 may make the power gating switch PGS1 remain off, such that the function circuit 200 shown in FIG. 2 is in an off state.

Next, when the input signal SIN switches from a logic level high voltage $V_{high}$ to a logic level low voltage $V_{low}$, the voltage outputted by the inverter INV1 and the inverter INV3 switches from a low level voltage to a high level voltage, and the voltage outputted by the inverter INV2 switches from a high level voltage to a low level voltage.

Anyhow, the output switch state of the inverter INV3 is quicker than the output switch state of the inverter INV2. Therefore, during the first sub-period (the period of time to to time $t_1$) of the powered period Pon, the high level voltage outputted by the third inverter INV3 will be transferred to the control terminal of the power gating switch PGS1 through the second switch S2, such that the control terminal voltage VG of the power gating switch PGS1 is pre-pulled up to the pre-charging voltage outputted by the third voltage source V3 (as shown in FIG. 4). It should be noted, because the transistor Q3 and the transistor Q4 discharge slowly, the control terminal voltage of the first switch S1 still has not dropped below a threshold voltage of the first switch S1 during the first period (the period of time to $t_0$ time $t_1$). Therefore, the first switch still remains off during the first sub-period (the period of time to $t_0$ time $t_1$).

In a step S430, the control circuit 230 in the power gating circuit 210 controls the first switch S1 during the second sub-period (the period of time $t_1$ to time $t_2$) of the powered period, such that the first voltage source V1 performs charging on the control terminal of the power gating switch PGS1 through the first switch S1. More specifically, when the voltage outputted by the inverter INV2 drops below the threshold voltage of the first switch S1, the first switch S1 will be turned on. Therefore, during the second sub-period (the period of time $t_1$ to time $t_2$), the first voltage source V1 may perform charging on the gate terminal of the power gating switch PGS1 through the first switch S1, such that the control terminal voltage VG of the power gating switch PGS1 is pulled up to the driving voltage outputted by the first voltage source V1 (as shown in FIG. 4). When the voltage outputted by the inverter INV2 drops below to be smaller than the threshold voltage of the second switch S2, the second switch S2 will turn off, so as to prevent the driving voltage outputted by the first voltage source V1 intruding to the third voltage source V3 through the transistor Q7.

In short, when the input signal SIN of the power gating circuit 210 switches from a logic level high voltage $V_{high}$ to a logic level low voltage $V_{low}$, the pre-charging circuit 220 in the power gating circuit 210 will perform pre-charging on the control terminal of the power gating switch PGS1. Then, the first switch S1 is controlled by the control circuit 230 in the power gating circuit 210, such that the first voltage source V1 continues to charge the control terminal of the power gating switch PGS1 through the first switch S1. Accordingly, during the process of the power gating operation, the power gating circuit 210 may lower the current consumed by the first voltage source V1 when the power gating switch PGS1 is switched.

In addition, in another embodiment of the disclosure, a third switch S3 may be disposed on the power gating circuit 210, as shown in FIG. 5. In the present embodiment, the third switch S3 is an NMOS transistor, however the disclosure is not limited thereto. A control terminal (for example, a gate) of the third switch S3 is coupled with a second terminal of the first switch S1. A first terminal (for example, a source) of the third switch S3 is coupled with the second terminal of the first transistor Q3 in the second inverter INV2. A second terminal (for example, a drain) of the third switch S3 is coupled with the control terminal of the first switch S1. When the control terminal voltage VG of the power gating switch PGS1 increases to greater than a threshold voltage of the third switch S3, the third switch S3 will turn on, such that a time for turning on the first switch S1 is sped up (namely, the slope of the voltage VG during the period of time $t_1$ to time $t_2$ shown in FIG. 4 will change).

Figure 6:
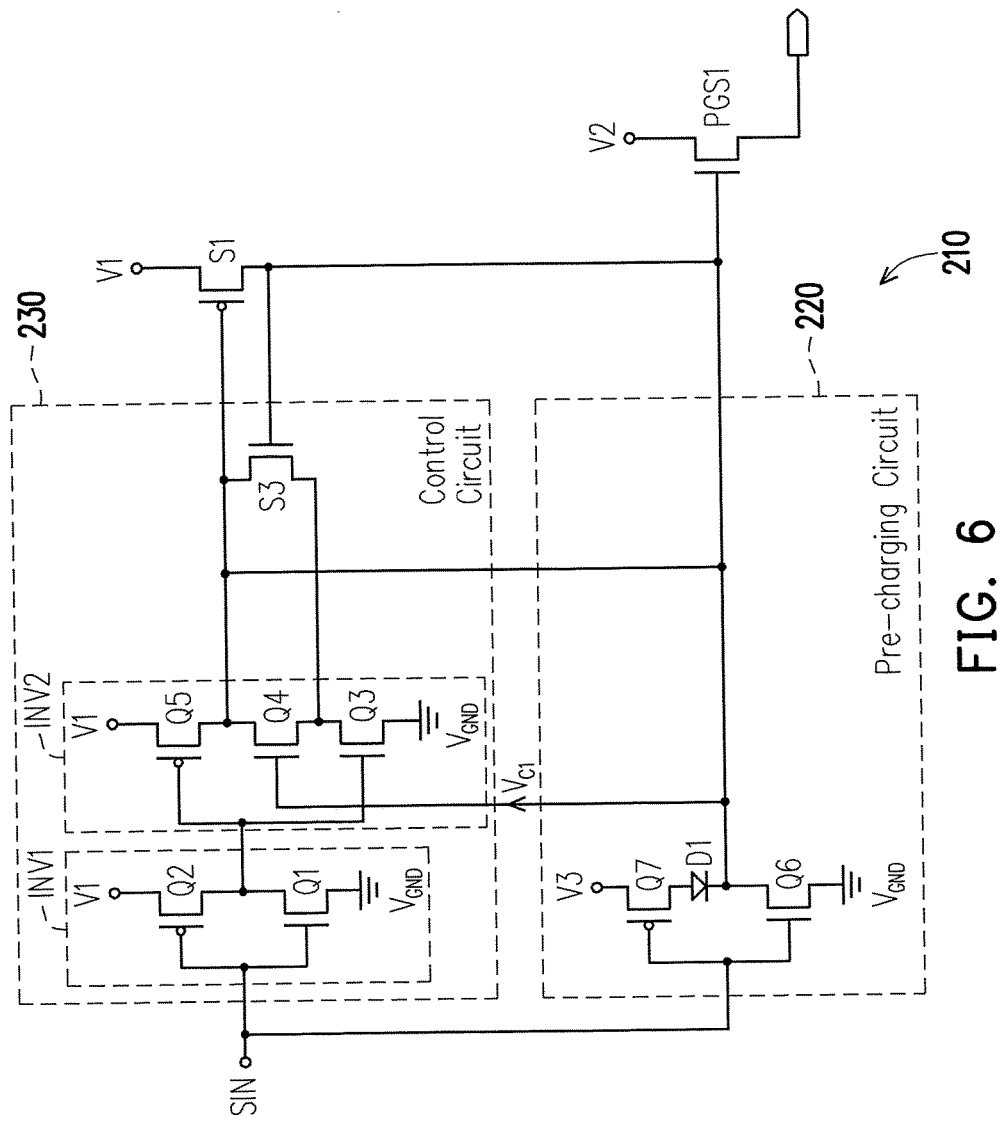
FIG. 6 is a schematic circuit diagram of the power gating circuit of FIG. 2 according to another embodiment of the disclosure.

However, the embodiment of the power gating circuit 210 shown in FIG. 2 is not limited to the above. For example, FIG. 6 is a circuit diagram of the power gating circuit 210 of FIG. 2 according to another embodiment of the disclosure. The functions and operation flow of the first switch S1, the power gating switch PGS1, the pre-charging circuit 220 and the control circuit 230 shown in FIG. 6 are the same as in FIG. 5 and will not be repeated here.

The main difference between FIG. 5 lies in, the pre-charging circuit 220 in FIG. 6 includes a first transistor Q6, a diode D1 and a second transistor Q7, wherein the first transistor Q6 is an NMOS transistor and the second transistor Q7 is a PMOS transistor; however it should not be construed as a limitation to the disclosure. A control terminal (for example, a gate) of the first transistor Q6 receives the input signal SIN. A first terminal (for example, a source) of the transistor Q6 is coupled with the ground voltage source $V_{GND}$. A second terminal (for example, a drain) of the first transistor Q6 is coupled with the control terminal of the power gating switch PGS1. A cathode of the diode D1 is coupled with the control terminal of the power gating switch PGS1. A control terminal (for example, a gate) of the second transistor Q7 receives the input signal SIN. A first terminal (for example, a drain) of the second transistor Q7 is coupled with an anode of the diode D1. A second terminal (for example, a source) of the second transistor Q7 is coupled with the third voltage source V3. The voltage of the first voltage source V1 may be greater than the voltage of the second voltage source V2 and/or the voltage of the third voltage source V3. For example (however not limited thereto), the voltage of the first voltage source V1 may be 2.95 V (or 2.75V, or other voltage level), the voltage of the second voltage source V2 may be 1.4V (or 1.05V, or other voltage level), the voltage of the third voltage source V3 may be 2V (or 1.6V, or other voltage level), and the voltage of the ground voltage source $V_{GND}$ may be 0V or other voltage level. Or, in other embodiments the voltages of the voltage sources V1, V2 and V3 may be set to any voltage level satisfying "V1>V3>V2". The characteristics of the diode D1 may prevent the driving voltage outputted by the first voltage source V1 intruding to the third voltage source V3 through the transistor Q7.

Figure 7:
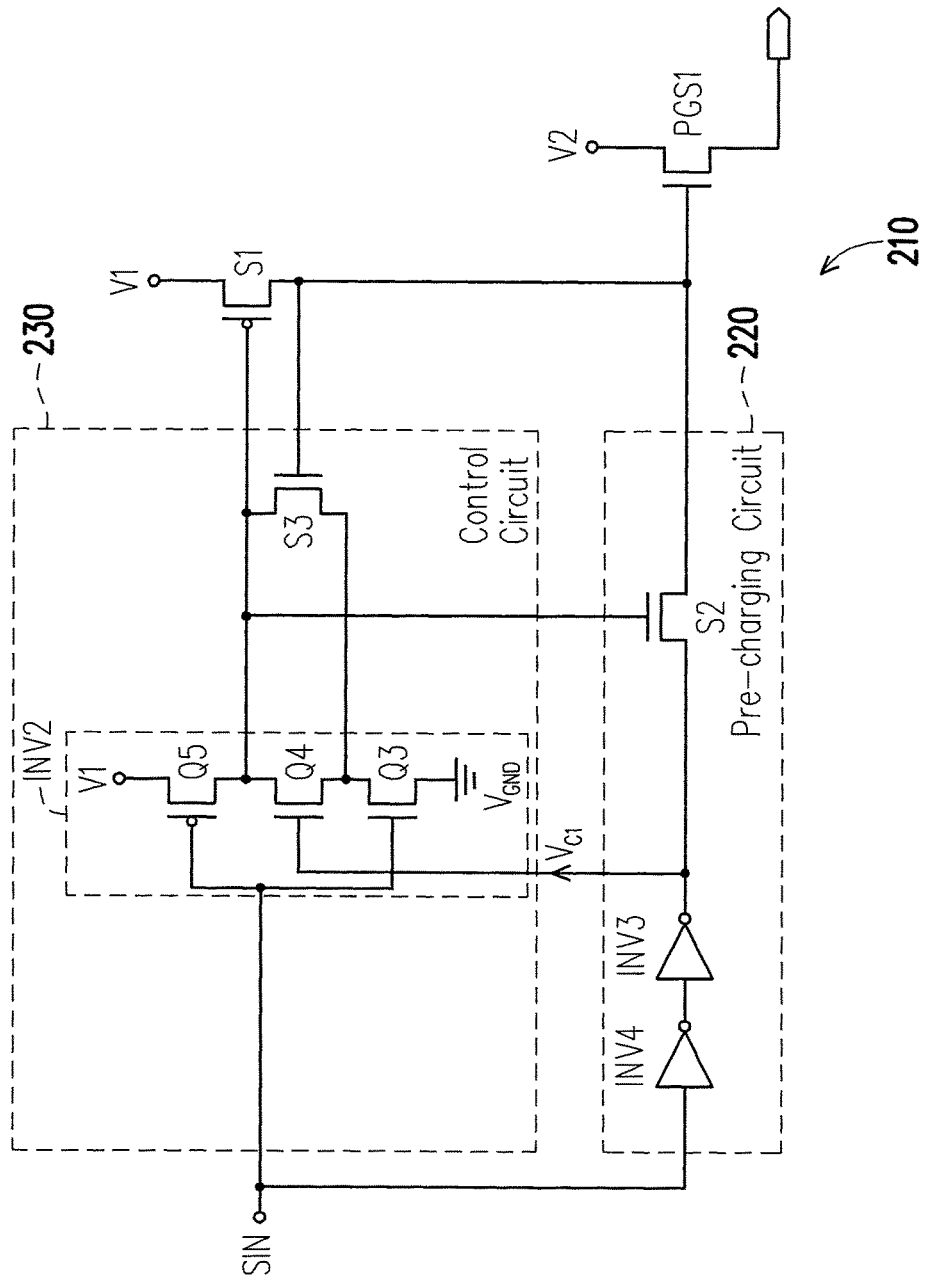
FIG. 7 is a schematic circuit diagram of the power gating circuit of FIG. 2 according to another embodiment of the disclosure.

FIG. 7 is a schematic circuit diagram of the power gating circuit 210 of FIG. 2 according to another embodiment of the disclosure. The functions and operation flow of the first switch S1, the power gating switch PGS1, the pre-charging circuit 220 and the control circuit 230 shown in FIG. 7 are the same as FIG. 5 and will not be repeated here. The main difference between FIG. 5 lies in, the internal structure of the pre-charging circuit 220 and the control circuit 230 of FIG. 7.

In the present embodiment, the control circuit 230 includes the second inverter INV2 and the third switch S3. An input terminal of the inverter INV2 receives the input signal SIN. An output terminal of the second inverter INV2 is coupled to the control terminal of the first switch S1. In addition, the output terminal of the second inverter INV2 is also coupled to the control terminal of the pre-charging circuit 220, so as to stop the pre-charging performed on the control terminal of the power gating switch PGS1 by the pre-charging circuit 220.

The first inverter INV1 in the control circuit 230 includes a first transistor Q3, a second transistor Q4 and a third transistor Q5, wherein the first transistor Q3 is an NMOS transistor, the second transistor Q4 is an NMOS transistors and the third transistor Q5 is a PMOS transistor, however it should not be construed as a limitation to the disclosure. A control terminal (for example, a gate) of the first transistor Q3 receives the input signal SIN. A first terminal (for example, a source) of the first transistor Q3 is coupled with the ground voltage source $V_{GND}$. A control terminal (for example, a gate) of the second transistor Q4 is coupled with the pre-charging circuit 220. A first terminal (for example, a source) of the second transistor Q4 is coupled with a second terminal (for example, a drain) of the first transistor Q3. A second terminal (for example, a drain) of the second transistor Q4 is coupled with the control terminal of the first switch S1. A control terminal (for example, a gate) of the third transistor Q5 receives the input signal SIN. A first terminal (for example, a drain) of the third transistor Q5 is coupled with the second terminal of the second transistor Q4. A second terminal (for example, a source) of the third transistor Q5 is coupled with the first voltage source V1. Reference may be made to the second inverter INV2 and the third switch S3 shown in FIG. 5 for details of the second inverter INV2 and the third switch S3 shown in FIG. 7, and will not be repeated here.

Continuing to refer to FIG. 7, the pre-charging circuit 220 includes the third inverter INV3, a fourth inverter INV4 and the second switch S2. An input terminal of the inverter INV4 receives the input signal SIN. An input terminal of the inverter INV3 is coupled to an output terminal of the inverter INV4. A first terminal (for example, a drain) of the second switch S2 is coupled with an output terminal of the third inverter INV3. A control terminal (for example, a gate) of the second switch S2 is coupled with the output terminal of the control circuit 230. A second terminal (for example, a source) of the second switch S2 is coupled with the control terminal of the power gating switch PGS1. Reference may be made to the third inverter INV3 shown in FIG. 5 for details of the third inverter INV3 and/or the inverter INV4 shown in FIG. 7, and reference may be made to the second switch S2 shown in FIG. 5 for details of the second switch S2 shown in FIG. 7, and will not be repeated here.

Figure 8:
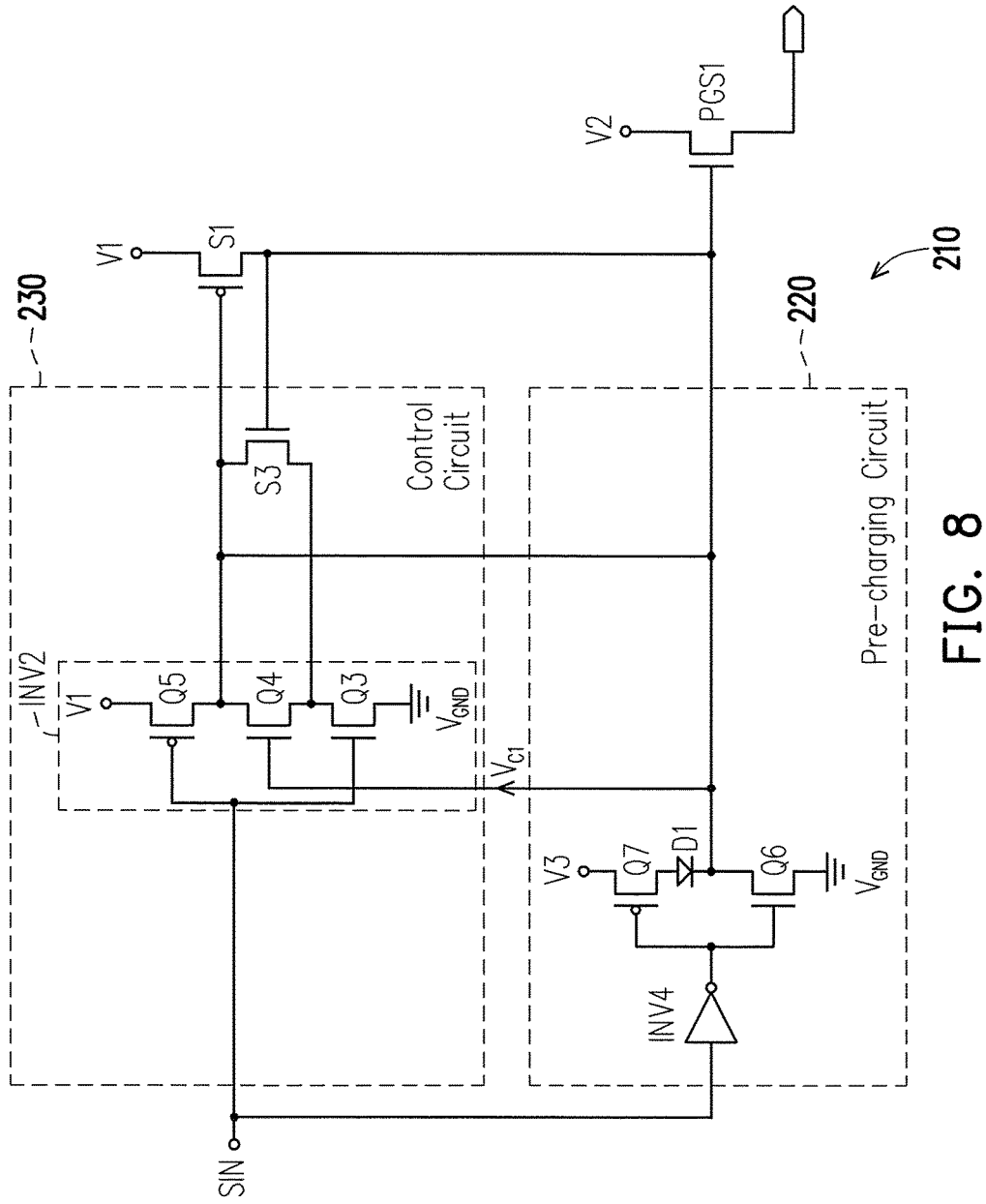
FIG. 8 is a schematic circuit diagram of the power gating circuit of FIG. 2 according to another embodiment of the disclosure.

FIG. 8 is a schematic circuit diagram of the power gating circuit of FIG. 2 according to another embodiment of the disclosure. The functions and operation flow of the first switch S1, the power gating switch PGS1, the pre-charging circuit 220 and the control circuit 230 shown in FIG. 8 are the same as FIG. 5 and will not be repeated here.

Reference may be made to the second inverter INV2, the fourth inverter INV4 and the third switch S3 shown in FIG. 7 for details of the second inverter INV2, the fourth inverter INV4 and the third switch S3 shown in FIG. 8, and will not be repeated here. The difference between FIG. 7 lies in, the pre-charging circuit 220 in FIG. 8 is constituted by the fourth inverter INV4, the first transistor Q6, a diode D1 and a second transistor Q7, wherein the first transistor Q6 is an NMOS transistor and the second transistor Q7 is a PMOS transistor, however it should not be construed as a limitation to the disclosure. An input terminal of the inverter INV4 receives the input signal SIN. A control terminal (for example, a gate) of the first transistor Q6 is coupled with the output terminal of the fourth inverter INV4. A first terminal (for example, a source) of the transistor Q6 is coupled with a ground voltage source $V_{GND}$. A second terminal (for example, a drain) of the first transistor Q6 is coupled with the control terminal of the power gating switch PGS1. A cathode of the diode D1 is coupled with the control terminal of the power gating switch PGS1. A control terminal (for example, a gate) of the second transistor Q7 is coupled with the output terminal of the fourth inverter INV4. A first terminal (for example, a drain) of the second transistor Q7 is coupled with an anode of the diode D1. A second terminal (for example, a source) of the second transistor Q7 is coupled with the third voltage source V3. Reference may be made to the first transistor Q6, the diode D1 and the second transistor Q7 shown in FIG. 6 for details of the first transistor Q6, the diode D1 and the second transistor Q7 shown in FIG. 8, and will not be repeated here.

Figure 9:
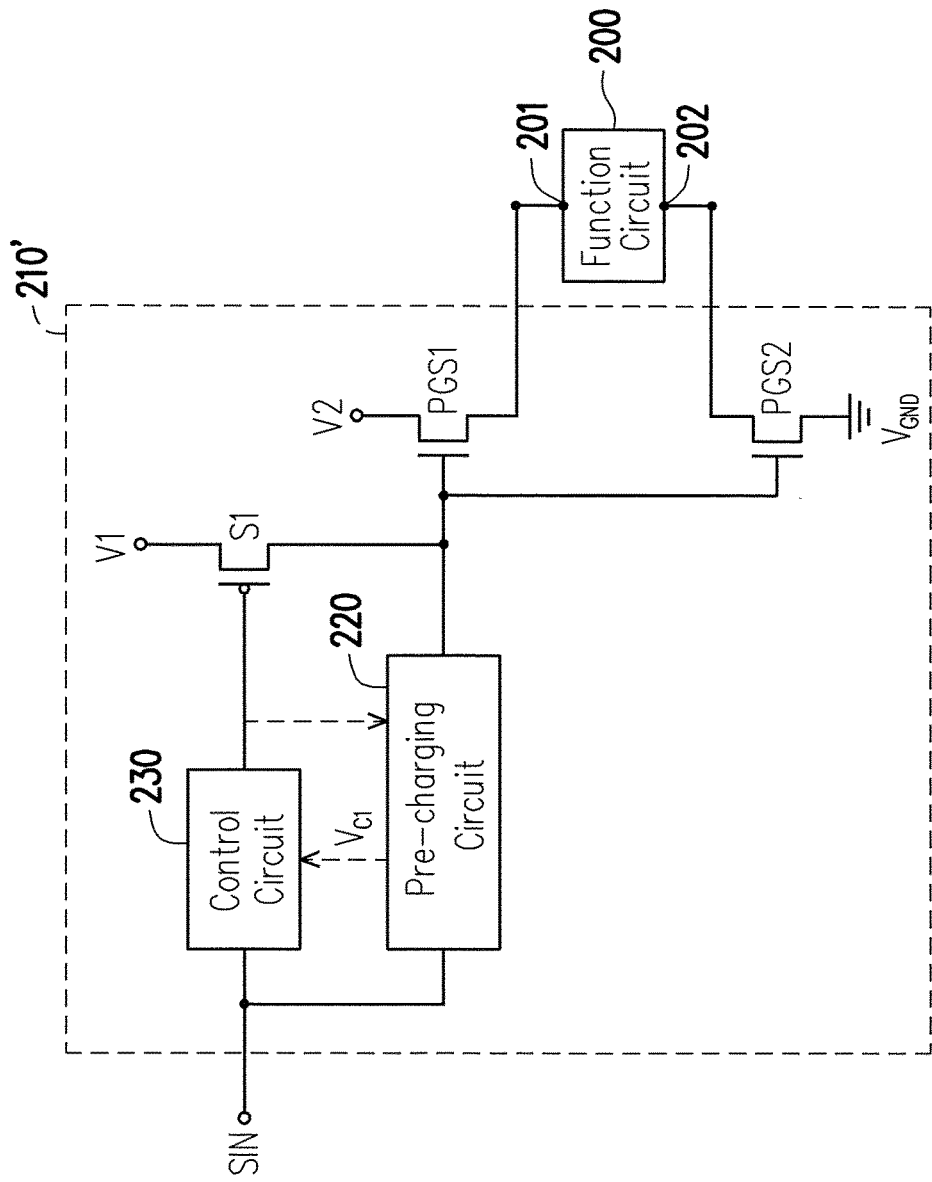
FIG. 9 is a schematic circuit diagram of the power gating circuit according to another embodiment of the disclosure.

However, the embodiments of the disclosure are not limited to the embodiment shown in FIG. 2. For example, FIG. 9 is a schematic circuit diagram of the power gating circuit 210' according to another embodiment of the disclosure. The function circuit 200 has power terminals 201 and 202, used to receive power required to operate the function circuit 200. The power gating circuit 210' includes the first switch S1, the power gating switch PGS1, a power gating switch PGS2, the pre-charging circuit 220 and the control circuit 230. Reference may be made to the function circuit 200, the first switch S1, the power gating switch PGS1, the pre-charging circuit 220 and the control circuit 230 shown in FIG. 2 to FIG. 8 for details of the function circuit 200, the first switch S1, the power gating switch PGS1, the pre-charging circuit 220 and the control circuit 230 shown in FIG. 9, and will not be repeated here. The second power gating switch PGS2 is an NMOS transistor similar to the first power gating switch PGS1, however the disclosure is not limited thereto. A control terminal (for example, a gate) of the second power gating switch PGS2 is coupled with a second terminal of the first switch S1. A first terminal (for example, a source) of the second power gating switch PGS2 is coupled with a voltage source (for example, the ground voltage source $V_{GND}$, however is not limited thereto). A second terminal of the second power gating switch PGS2 (for example, a drain) is coupled to the second power terminal 201 of the function circuit 200. In the present embodiment, the pre-charging circuit 220 and the control circuit 230 in the power gating circuit 210' similarly may achieve the effect of the above embodiments of charging the control terminals of the power gating switches PGS1 and PGS2 through two stages.

In summary, the embodiments of the disclosure disclose a power gating circuit and a control method for the power gating switch thereof. When the input signal of the power gating circuit is switched, the pre-charging circuit in the power gating circuit will perform pre-charging on the control terminal of the power gating switch. Then, the first switch is controlled through the control circuit in the power gating circuit, such that the first voltage source continues to perform charging on the control terminal of the power gating switch through the first switch. Accordingly, not only may the large current consumed by the first voltage source be reduced, the voltage pump of the first voltage source and the capacitor layout area may also be reduced, and achieving the advantages of a small first voltage source layout area and good power efficiency.

It will be apparent to those skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:
1. A power gating circuit, comprising:
a first switch, a first terminal of the first switch is coupled with a first voltage source;
a power gating switch, a control terminal of the power gating switch is coupled with a second terminal of the first switch, a first terminal of the power gating switch is coupled with a second voltage source, a second terminal of the power gating switch is used to couple to a power terminal of a function circuit;

a pre-charging circuit, an input terminal of the pre-charging circuit receives an input signal, an output terminal of the pre-charging circuit is coupled with the control terminal of the power gating switch, wherein the input signal defines a powered period of the function circuit, the pre-charging circuit is used to perform pre-charging on the control terminal of the power gating switch during a first sub-period of the powered period; and a control circuit, an input terminal of the control circuit receives the input signal, an output terminal of the control circuit is coupled with a control terminal of the first switch, wherein the control circuit controls the first switch such that the first voltage source performs charging on the control terminal of the power gating switch during a second sub-period of the powered period, wherein the pre-charging circuit further outputs a control signal to a control terminal of the control circuit, such that the first switch remains off before the pre-charging circuit performs the pre-charging on the control terminal of the power gating switch.

2. The power gating circuit as claimed in claim 1, wherein the output terminal of the control circuit is also coupled with a control terminal of the pre-charging circuit, to stop the pre-charging circuit performing the pre-charging on the control terminal of the power gating switch.

3. The power gating circuit as claimed in claim 1, wherein the control circuit comprises:

a first inverter, an input terminal of the first inverter receives the input signal; and a second inverter, an input terminal of the second inverter is coupled with an output terminal of the first inverter, and an output terminal of the second inverter is coupled with the control terminal of the first switch, wherein the output terminal of the second inverter is also coupled with a control terminal of the pre-charging circuit, to stop the pre-charging circuit performing the pre-charging on the control terminal of the power gating switch.

4. The power gating circuit as claimed in claim 3, wherein the control circuit further comprises:

a second switch, wherein a control terminal of the second switch is coupled with the second terminal of the first switch, a first terminal of the second switch is coupled with the second inverter, a second terminal of the second switch is coupled with the control terminal of the first switch, to speed up a turn on of the first switch.

5. The power gating circuit as claimed in claim 1, wherein the control circuit comprises:

an inverter, an input terminal of the inverter receives the input signal, and an output terminal of the inverter is coupled with the control terminal of the first switch, wherein the output terminal of the inverter is also coupled with a control terminal of the pre-charging circuit, to stop the pre-charging circuit performing the pre-charging on the control terminal of the power gating switch.

6. The power gating circuit as claimed in claim 5, wherein the control circuit further comprises:

a second switch, wherein a control terminal of the second switch is coupled with the second terminal of the first switch, a first terminal of the second switch is coupled with the inverter, a second terminal of the second switch is coupled with the control terminal of the first switch, to speed up a turn on of the first switch.

7. The power gating circuit as claimed in claim 1, wherein the pre-charging circuit comprises:

an inverter, an input terminal of the inverter receives the input signal; and a second switch, a first terminal of the second switch is coupled with an output terminal of the inverter, a control terminal of the second switch is coupled with the output terminal of the control circuit, a second terminal of the second switch is coupled with the control terminal of the power gating switch.

8. The power gating circuit as claimed in claim 1, wherein the pre-charging circuit comprises:

a first transistor, a control terminal of the first transistor receives the input signal, a first terminal of the first transistor is coupled with a ground voltage source, a second terminal of the first transistor is coupled with the control terminal of the power gating switch;

a diode, a cathode of the diode is coupled with the control terminal of the power gating switch; and a second transistor, a control terminal of the second transistor receives the input signal, a first terminal of the second transistor is coupled with an anode of the diode, a second terminal of the second transistor is coupled with a third voltage source which is different from the first voltage source.

9. The power gating circuit as claimed in claim 8, wherein a voltage of the first voltage source is greater than a voltage of the second voltage source and a voltage of the third voltage source.

10. The power gating circuit as claimed in claim 1, wherein the pre-charging circuit comprises:

a first inverter, an input terminal of the first inverter receives the input signal;

a second inverter, an input terminal of the second inverter is coupled with an output terminal of the first inverter; and a second switch, a first terminal of the second switch is coupled with an output terminal of the second inverter, a control terminal of the second switch is coupled with the output terminal of the control circuit, a second terminal of the second switch is coupled with the control terminal of the power gating switch.

11. The power gating circuit as claimed in claim 1, wherein the pre-charging circuit comprises:

an inverter, an input terminal of the inverter receives an input signal;

a first transistor, a control terminal of the first transistor is coupled with an output terminal of the inverter, a first terminal of the first transistor is coupled with a ground voltage source, a second terminal of the first transistor is coupled with the control terminal of the power gating switch;

a diode, a cathode of the diode is coupled with the control terminal of the power gating switch; and a second transistor, a control terminal of the second transistor is coupled with the output terminal of the inverter, a first terminal of the second transistor is coupled with an anode of the diode, a second terminal of the second transistor is coupled with a third voltage source.

12. A control method for a power gating switch, adapted for a power gating circuit, the control method comprising:
   receiving an input signal, wherein the input signal defines a powered period of a function circuit;
   performing pre-charging on a control terminal of the power gating switch through a pre-charging circuit in the power gating circuit during a first sub-period of the powered period; and
   controlling a first switch through a control circuit in the power gating circuit during a second sub-period of the powered period, such that a first voltage source performs charging on the control terminal of the power gating switch through the first switch, wherein the pre-charging circuit further outputs a control signal to the control circuit, such that the first switch remains off before the pre-charging circuit performs the pre-charging on the control terminal of the power gating switch.

\* \* \* \* \*